(12) United States Patent
Tung et al.

(10) Patent No.: US 11,980,018 B2
(45) Date of Patent: May 7, 2024

(54) SEMICONDUCTOR DEVICE AND METHOD OF FABRICATING THE SAME

(71) Applicant: Fujian Jinhua Integrated Circuit Co., Ltd., Quanzhou (CN)

(72) Inventors: Yu-Cheng Tung, Kaohsiung (TW); Janbo Zhang, Zhangzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 347 days.

(21) Appl. No.: 17/396,752

(22) Filed: Aug. 8, 2021

(65) Prior Publication Data
US 2023/0008059 A1    Jan. 12, 2023

(30) Foreign Application Priority Data

Jul. 9, 2021 (CN) .......................... 202110778040.9
Jul. 9, 2021 (CN) .......................... 202121569429.4

(51) Int. Cl.
*H10B 12/00* (2023.01)
*H01L 21/768* (2006.01)
*H01L 23/522* (2006.01)
*H01L 23/532* (2006.01)

(52) U.S. Cl.
CPC ... *H10B 12/0335* (2023.02); *H01L 21/76831* (2013.01); *H01L 21/76843* (2013.01); *H01L 23/5226* (2013.01); *H10B 12/315* (2023.02); *H01L 23/53223* (2013.01); *H01L 23/53238* (2013.01); *H01L 23/53266* (2013.01)

(58) Field of Classification Search
CPC ............. H10B 12/0335; H10B 12/315; H10B 12/482; H10B 12/485; H01L 21/76831; H01L 21/76843; H01L 23/5226; H01L 23/53238
See application file for complete search history.

(56) References Cited

U.S. PATENT DOCUMENTS

| | | | |
|---|---|---|---|
| 9,041,122 B2 | 5/2015 | Yoo et al. | |
| 10,373,960 B2 | 8/2019 | Kim et al. | |
| 10,573,651 B2 | 2/2020 | Kim et al. | |
| 10,580,876 B2 | 3/2020 | Ahn et al. | |
| 2014/0299989 A1* | 10/2014 | Lim | H10B 12/0335 257/751 |
| 2015/0371891 A1* | 12/2015 | Lee | H10B 12/0335 438/653 |
| 2016/0247760 A1* | 8/2016 | Lee | H01L 23/5222 |
| 2021/0020641 A1 | 1/2021 | Lee et al. | |

* cited by examiner

*Primary Examiner* — Jaehwan Oh
*Assistant Examiner* — John M Parker
(74) *Attorney, Agent, or Firm* — Winston Hsu (57) ABSTRACT

The present disclosure relates to a semiconductor device and a method of fabricating the same, which includes a substrate, a plurality of bit lines, a plurality of first plugs, a first spacer, a second spacer, a plurality of second plugs and a metal silicide layer. The bit lines are disposed on the substrate. The first plugs are disposed on the substrate and separated from the bit lines. The first spacer and the second spacer are disposed between each of the bit lines and the first plugs, and include a first height and a second height respectively. The second plugs are disposed on the first plugs respectively, and the metal silicide layer is disposed between the first plugs and the second plugs, wherein an end surface of the metal silicide layer is clamped between the second spacer and the first spacer.

20 Claims, 7 Drawing Sheets

SEMICONDUCTOR DEVICE AND METHOD OF FABRICATING THE SAME

BACKGROUND OF THE INVENTION

1. Field of the Invention

The present disclosure generally relates to a semiconductor device and a method of fabricating the same, and more particularly, to a semiconductor memory device and a method of fabricating the same.

2. Description of the Prior Art

For years the trend in the memory industry as well as the semiconductor industry has been to scale down the size of memory cells in order to increase the integration level and thus the memory capacity of DRAM chips. In a DRAM cell with a buried gate, the current leakage caused by a capacitor is often reduced or avoided thanks to a relatively long channel length beneath the buried gate. Therefore, more and more DRAM cells are equipped with buried gates rather than with a conventional planar gate structure due to their superior performances.

In general, the DRAM cells with a buried gate include an array area formed by a large number of memory cells for storage signals, wherein each of the memory cell includes a transistor element and a capacitor element connected with thereto, which is able to accept signals from a bit line and a word line during the operation. In order to meet the demand of products, the density of the memory cells in the array area is requested to be continuously improved, which results in the increasing difficulty and complexity in the related fabricating process and design. Therefore, there is still a need to provide an improved technique to gain enhanced performance and reliability of the corresponding memory device.

SUMMARY OF THE INVENTION

One of the objectives of the present disclosure provides a method of fabricating a semiconductor device, in which a metal silicide layer is additionally disposed between the bottom plug and the top plug through a metal silicidation process, so that, the metal silicide layer may straddle the spacer disposed at two sides of the bit lines. Accordingly, the fabricating method of the present disclosure may form a plug structure with better contact with the substrate, thereby forming a semiconductor device with more optimized structure, so as to improve the electrical connection between the storage node contact and the transistor element disposed underneath.

One of the objectives of the present disclosure provides a semiconductor device, in which a metal silicide layer is additionally disposed between the bottom plug and the top plug, so that, the metal silicide layer may straddle over the spacer disposed at two sides of the bit lines. Accordingly, the semiconductor device of the present disclosure may therefore obtain a plug structure with better contact with the substrate, so as to improve the electrical connection between the storage node contact and the transistor element disposed underneath.

To achieve the purpose described above, one embodiment of the present disclosure provides a method of fabricating a semiconductor device, including the following steps. Firstly, a substrate is provided, and a plurality of bit lines is formed on the substrate. Next, a plurality of first plugs is formed on the substrate, with the bit lines and the first plugs being alternately arranged with each other. Then, a first spacer is formed on the substrate, between each of the bit lines and the first plugs, the first spacer extends upwardly from a top surface of the substrate by a first height, and a second spacer is formed on the substrate, between the first spacer and the first plugs, the second spacer extends upwardly from the top surface of the substrate by a second height, wherein the first height is higher than the second height. Subsequently, a plurality of second plugs is formed on the first plugs respectively, and a metal silicide layer is formed on the substrate, the metal silicide layer is disposed between the first plugs and the second plugs, and an end surface of the metal silicide layer is clamped between the first spacer and the second spacer.

To achieve the purpose described above, one embodiment of the present disclosure provides a semiconductor device including a substrate, a plurality of bit lines a plurality of first plugs, a first spacer, a second spacer, a plurality of second plugs and a metal silicide layer. The bit lines are disposed on the substrate. The first plugs are disposed on the substrate and separated from the bit lines. The first spacer is disposed on the substrate and between the bit lines and the first plugs, and the first spacer extends upwardly from a top surface of the substrate by a first height, and a second spacer is disposed on the substrate and between the first spacer and the first plugs, and the second spacer extends upwardly from the top surface of the substrate by a second height, wherein the first height is higher than the second height. The second plugs are disposed on the first plugs respectively, and the metal silicide layer is disposed between the first plugs and the second plugs, wherein an end surface of the metal silicide layer is clamped between the second spacer and the first spacer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 7 are schematic diagrams illustrating steps of a fabricating method of a semiconductor device according to a first preferable embodiment in the present disclosure, wherein:

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
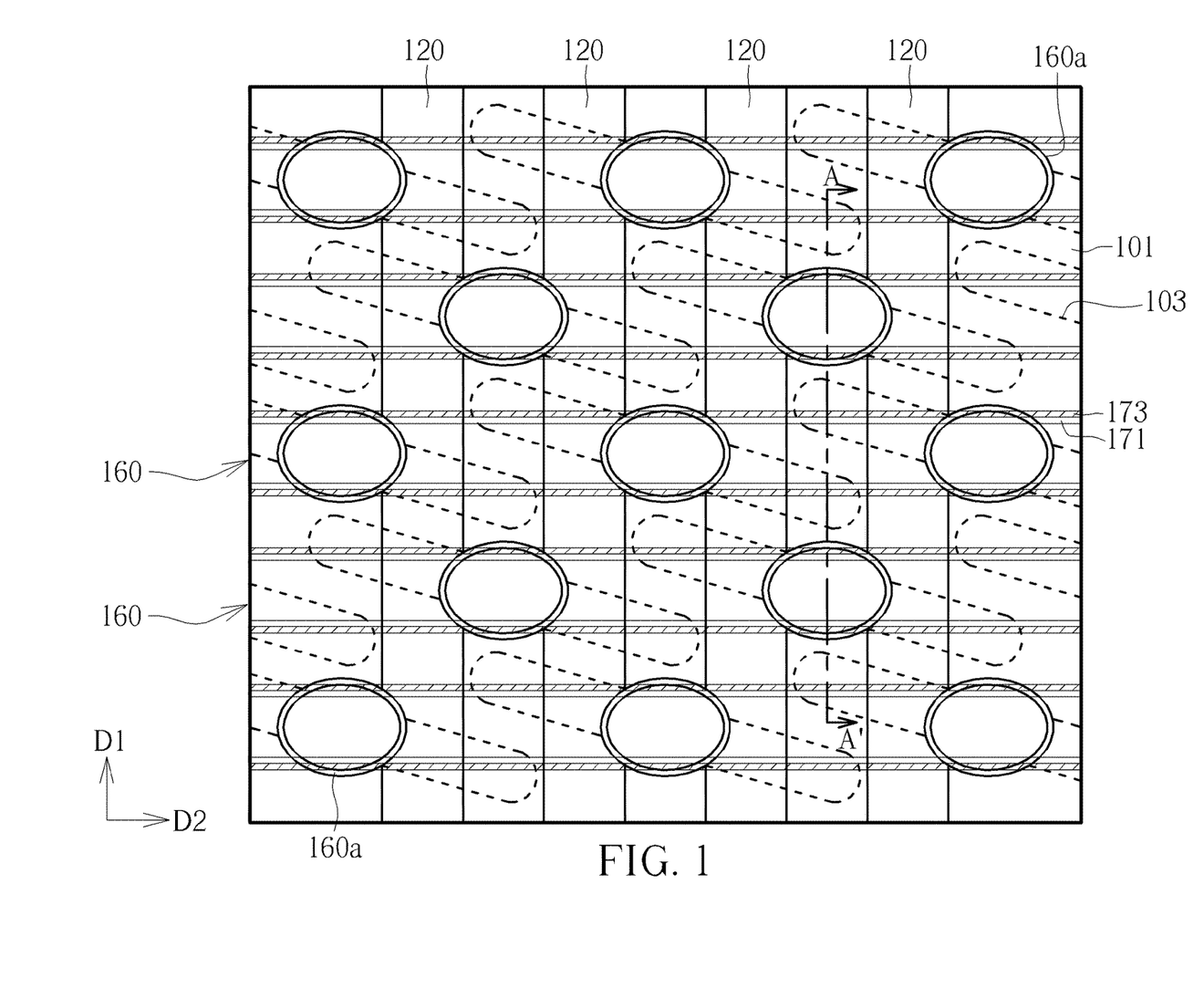
FIG. 1 shows a top view of a semiconductor device after forming bit lines.

Please refer to FIGS. 1-7, which illustrate schematic diagrams of steps of a fabricating method of a semiconductor device 100 according to the first preferable embodiment in the present disclosure, with FIG. 1 illustrating a top view of the semiconductor device 100 during fabricating, and with FIGS. 2-7 illustrating cross-sectional views of the semiconductor device 100 during the fabricating. The semiconductor device 100 of the present embodiment is for example a dynamic random access memory (DRAM), which includes at least one transistor element and at least one capacitor element, to function like a smallest memory cell in a DRAM array for receiving the voltage signals from bit lines 160 and word lines 120 during the operation.

The semiconductor device 100 includes a substrate 110, such as a silicon substrate, a silicon containing substrate like SiC or SiGe, or a silicon on insulator (SOI) substrate, and at least one isolated area 101 such as a shallow trench isolation (STI) is formed in the substrate 110 to define a plurality of active areas (AA) 103 therein. The formation of the isolated area 101 is but not limited to be accomplished by performing an etching process to form a plurality of trenches (not shown in the drawings) in the substrate 110, followed by forming an insulating material such as silicon oxide (SiO) or silicon oxynitride (SiON) in the trenches.

As shown in FIG. 1, a plurality of buried gate structures (not shown in the drawings) is formed in the substrate 110, to extend along the same direction D1 to intersect with the active areas 103, thereby functioning like buried word lines (BWL) 120 of the semiconductor device 100. Please refer to FIG. 2, each of the bit lines 160 is separately with each other in the direction D1, and which includes a semiconductor layer (for example including polysilicon) 161, a barrier layer (for example including titanium and/or titanium nitride) 163, and a conductive layer (for example including a low resistant metal like tungsten, aluminum, or copper) 165, and a cover layer 167 (for example including silicon oxide, silicon nitride, or silicon oxynitride), but is not limited thereto. It is noted that, a portion of the bit lines 162 are formed on the dielectric layer 130 disposed on the substrate 110, wherein, the dielectric layer 130 preferably includes a multilayer structure, preferably referring to an oxide layer 131-nitride layer 133-oxide layer 135 (ONO) structure, but is not limited thereto. Another portion of the bit lines 164 further include a bit line contact (BLC) 160a formed below, so as to further extend into the substrate 110. The bit lines 162 and the bit lines 164 are alternately arranged with each other, with each of the bit lines 164 being disposed between two adjacent ones of the bit lines 162, and the bit line contacts 160a formed below the bit lines 164 and the semiconductor layer 161 of the bit lines 164 are monolithic, to directly contact the substrate 110, as shown in FIG. 2.

Figure 2:
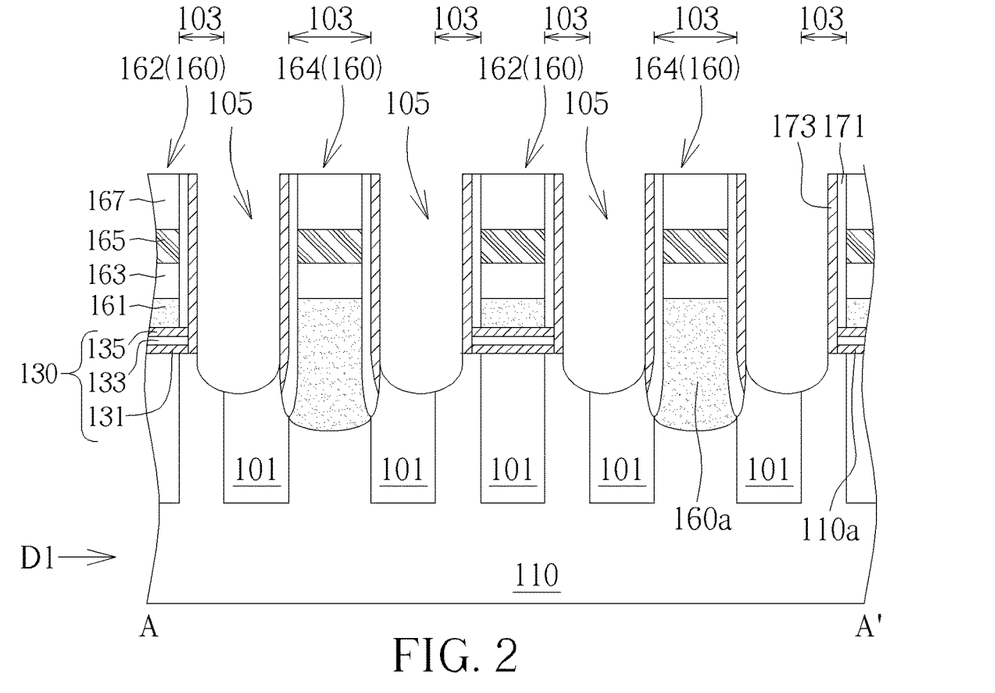
FIG. 2 shows a cross-sectional view of a semiconductor device taken along a cross-line A-A' in FIG. 1.

As shown in FIG. 2, a spacer 171 and a spacer 173 are sequentially formed on the sidewall of each bit line 160. In one embodiment, the spacer 171 and the spacer 173 are formed through different deposition and etching processes, so that, the spacer 171 and the spacer 173 may respectively include a stripe shape and include different insulating material. For example, the formation of the spacer 171 may be firstly carried out by entirely depositing a silicon nitride material layer (not shown in the drawings) to cover the top surfaces, and the sidewalls of the bit lines 160 and the top surface of the dielectric layer 130, followed by performing an etching back process to partially remove the silicon nitride material layer and to form the spacer 171 including silicon nitride. Then, the formation of the spacer 173 is carried out by entirely depositing a silicon oxide material layer (not shown in the drawings) to cover the top surface of each bit line 160, the spacer 171, and the top surface 110a of the substrate 110, followed by performing another etching back process, to partially remove the silicon oxide material layer and to form the spacer 173 including silicon oxide, but is not limited thereto. Then, the spacers 171, 173 may therefore have coplanar top surfaces. Also, after performing the etching back process of the spacer 171, the dielectric layer 130 disposed underneath may be optionally patterned, and the spacer 173 formed subsequently may be disposed on the top surface 110a of the substrate 110. It is noted that, in the present embodiment, the spacers 171, 173 formed on a portion of the bit lines 162 are namely disposed over the top surface of the dielectric layer 130 and the top surface 110a of the substrate, and the spacers 171, 173 formed on another portion of the bit lines 164 are further extended into the substrate 110 to disposed on the sidewalls of the bit line contacts 160a, as shown in FIG. 2.

Figure 3:
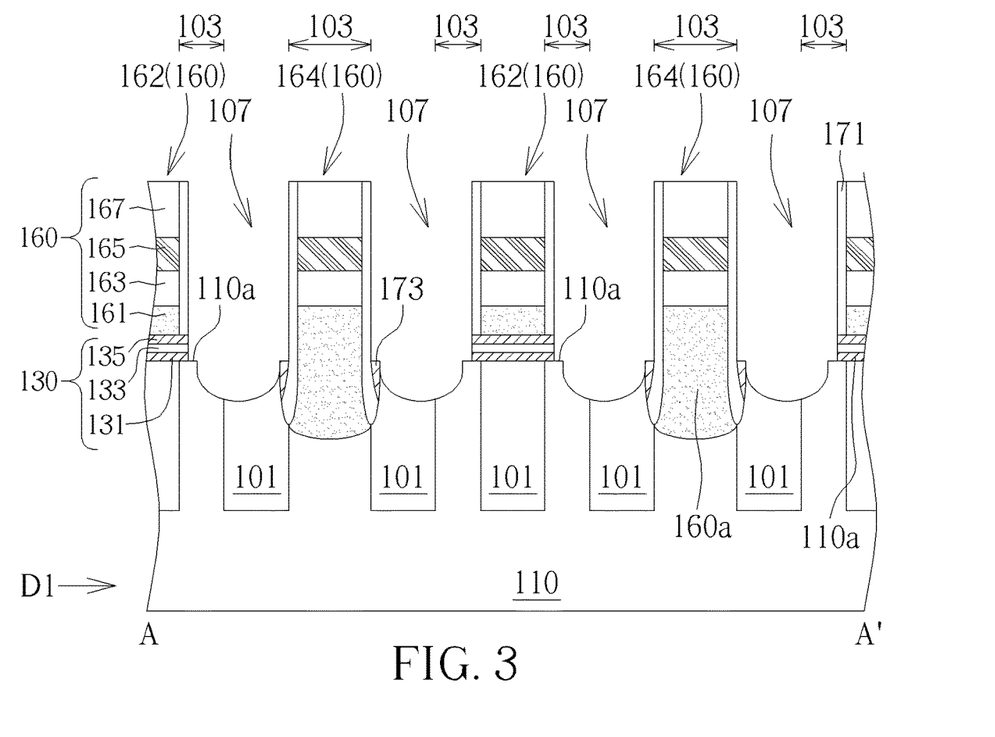
FIG. 3 shows a cross-sectional view of a semiconductor device after performing an etching process.

Then, an interlayer dielectric layer (ILD, not shown in the drawings) may be formed on the substrate 110 to fill up the gaps between the bit lines 160 and the spacers 171, 173 and to obtain a coplanar surface entirely. After that, at etching process is performed by using the bit lines 160 and the spacers 171, 173 as an etching mask, to remove a portion of the interlayer dielectric layer and the substrate 110 (namely, the active areas 103) and the isolated area 101 underneath, and to simultaneously define a plurality of openings 105 between the adjacent bit lines 160 and the spacers 171, 173, being configured as the contact openings, wherein the bottom of each of the openings 105 is lower than the top surface 110a of the substrate 110, as shown in FIG. 2. Next, as shown in FIG. 3, another etching process is performed to remove the spacer 173 disposed on the top surface 110a of the substrate 110, and to only remain the spacer 173 extended into the substrate 110 and disposed on the sidewalls of the bit line contact 160a. Accordingly, the openings 105 may be expanded to form openings 107, to expose a portion of the top surface 110a of the substrate 110.

Figure 4:
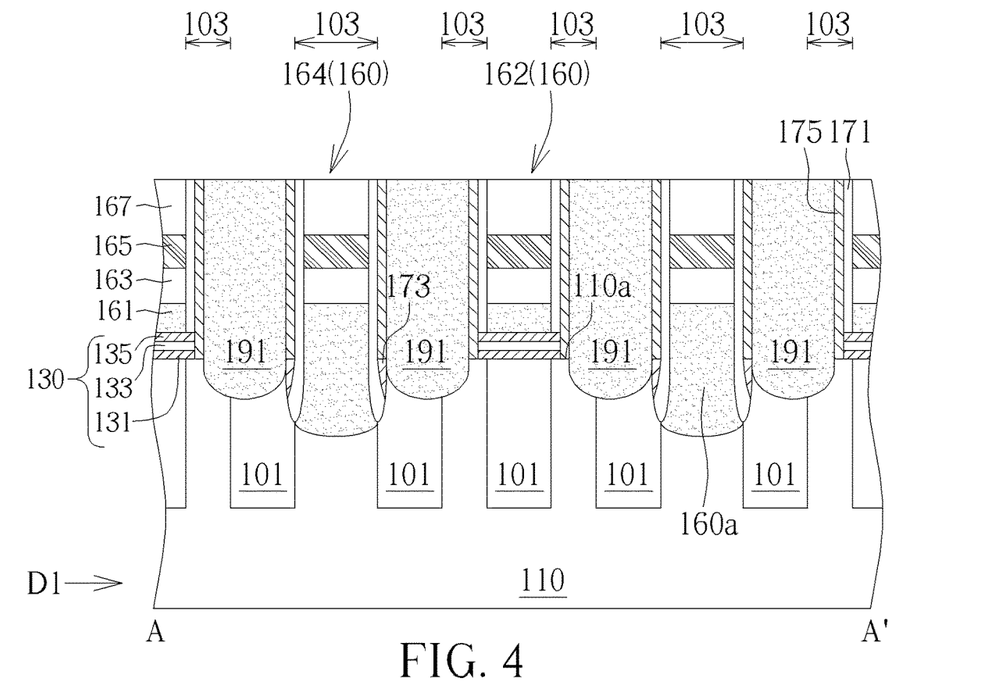
FIG. 4 shows a cross-sectional view of a semiconductor device after forming a conductive layer.

As shown in FIG. 4, a deposition process and an etching back process are sequentially performed to form a spacer 175 on the sidewalls of each opening 107, wherein the spacer 175 is disposed on the exposed portion of the top surface 110a of the substrate 110 and the remain part of the spacer 173. Following these, another deposition process and a planarization process (for example a chemical mechanical polishing) are sequentially performed, to form a conductive layer 191 in the openings 107 to fill in the openings 107 and to directly contact the substrate 110 (active area 103) and the isolated area 101 underneath. In one embodiment, the spacer 175 preferably includes a material which is different from that of the spacers 171, 173, such as including silicon oxynitride (SiON), silicon carbonitride (SiCN) to reduce the resistance. The conductive layer 191 is preferably formed through an epitaxial growth process, and which may include a material like polysilicon or silicon phosphate (SiP), but is not limited thereto.

Figure 5:
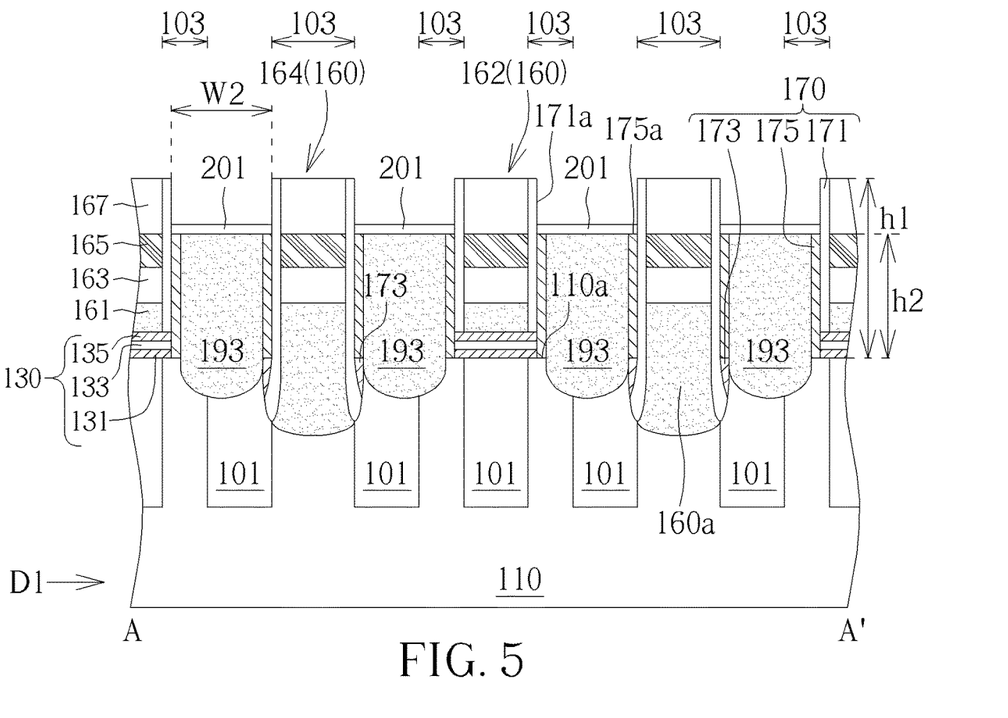
FIG. 5 shows a cross-sectional view of a semiconductor device after forming a metal silicide layer.

Then, as shown in FIG. 5, an etching process is performed by using the bit lines 160 and the spacer 171 as an etching mask, to remove a part of the spacer 175 and a part of the conductive layer 191, and a metal silicidation process or a self-aligned metal silicidation process is performed to simultaneously form a plurality of plugs 193 filling in the bottom of the openings 107 respectively, and to form a silicide layer 201 disposed on the top surface of each plug 193. Precisely speaking, the plugs 193 and the bit lines 160 are separately from each other, and the spacers 171, 173, 175 are disposed between the plugs 193 and the bit lines 160 for isolating from each other, wherein the bottom of each plug 193 directly contacts the active area 103 and/or the isolated region 101 disposed within the substrate 110. The metal silicide layer 201 is disposed on the plugs 193 and the spacer 175, with two end surfaces at two sides thereof being clamped between the top surface 175a of the spacer 175 and the sidewall 171a of the spacer 171, to directly contact the spacer 175 (the top surface 175a thereof) and the spacer 171 (the sidewall 171a). In one embodiment, the metal silicide layer 201 for example includes titanium silicide ($TiSi_x$), tungsten silicide ($WSi_x$), tantalum silicide ($TaSi_x$), molybdenumsilicide ($MoSi_x$), cobalt Silicide ($CoSi_x$), or nickel silicide ($NiSi_x$), but is not limited thereto.

It is noted that, since the formation of the metal silicide layer 201 may consume a part of the conductive layer 191, the top surface (not shown in the drawings) of the conductive layer 191 after performing the etching process may be slightly higher than the top surface 175a of the spacer 175 while etching the spacer 175 and the conductive layer 191. Then, after forming the metal silicide layer 201, the top surface of the plug 193 may be substantially coplanar with the top surface 175a of the spacer 175, and the metal silicide layer 201 may be substantially disposed at an interface between the conductive layer 165 of the bit lines 160 and the covering layer 167, as shown in FIG. 5. Also, since the lattice structure of the metal silicide layer 201 is greater than the lattice structure of the conductive layer 191, the volume of the metal silicide layer 201 may slightly expand and extend to the top surface 175a of the spacer 175. In this way, the metal silicide layer 201 may directly contact a part of the sidewall 171a of the spacer 171, the top surface 175a of the spacer 175 and the top surface of the plug 193, to obtain a relative greater width W2. On the other hand, after the etching process, the spacer 175 and the spacer 171 disposed on the substrate 110, and the spacer 173 disposed within the substrate 110 may together form a spacer structure 170. The spacer 171 is directly disposed on the sidewall of each bit line 160, and which is extended upwardly from the top surface 110a of the substrate by a height h1. The spacer 175 is disposed between each bit line 160 and each plug 193, and which is also extended upwardly from the top surface 110a of the substrate 110 by a height h2, and the height h1 is greater than the height h2. On the other hand, the spacer 173 is disposed under a part of the spacer 175, to extend into the substrate 110, as shown in FIG. 5.

Figure 6:
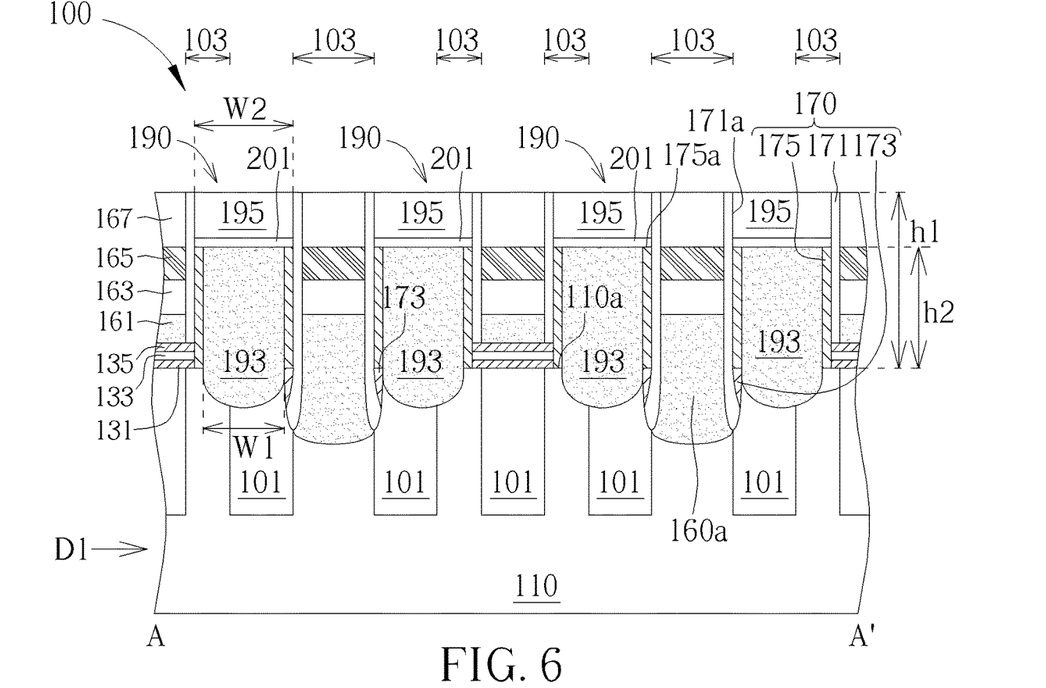
FIG. 6 shows a cross-sectional view of a semiconductor device after forming a storage node contact.

Subsequently, as shown in FIG. 6, another deposition and planarization processes (for example the chemical mechanical polishing process) is performed to form a conductive layer at least filled up the openings 107, thereby being configured as a plurality of plugs 195 filled up the top portion of the openings 107 respectively. In one embodiment, the conductive layer for example includes a low resistant metal such as aluminum (Al), titanium (Ti), copper (Cu), or tungsten (W), but is not limited thereto. The plugs 195 are disposed on the metal silicide layer 201 to obtain a maximum width W2 in the direction D1, and the maximum width W2 is greater than a maximum width W1 of the plugs 193. Then, the plugs 193, the metal silicide layer 201 and the plugs 195 may together form storage node contacts (SNCs) 190 of the semiconductor device, which may directly contacts the substrate 110 and/or the isolated region 101.

Figure 7:
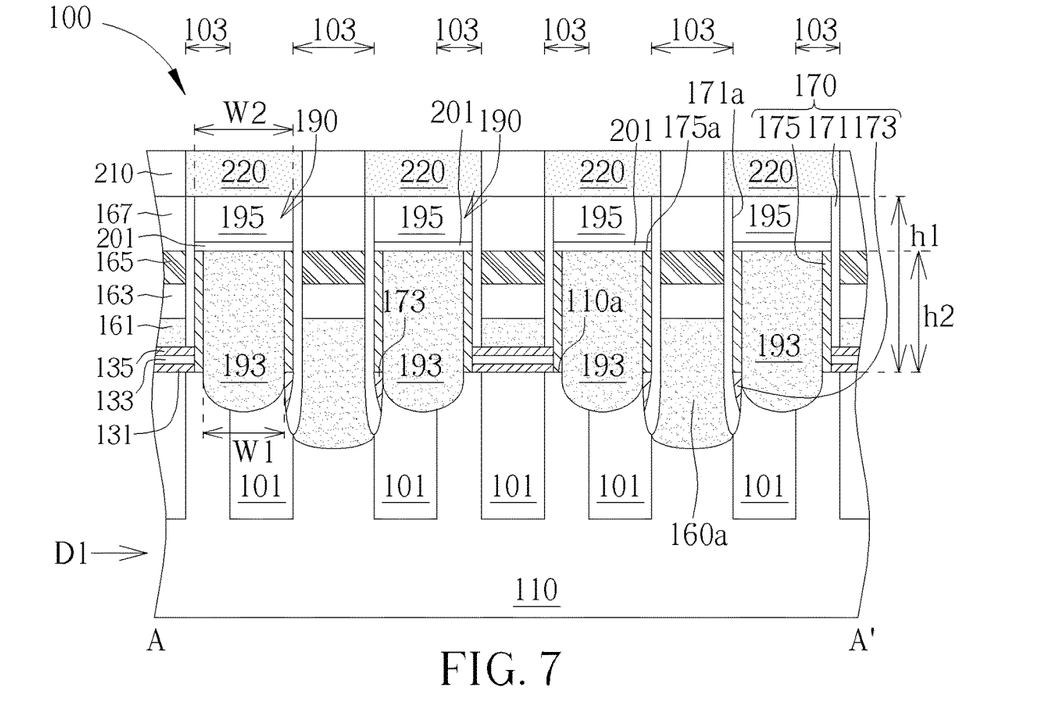
FIG. 7 shows a cross-sectional view of a semiconductor device after forming a storage node pad.

Finally, as shown in FIG. 7, a plurality of storage node pads (SN pads) 220 is formed on a dielectric layer 210 disposed on the substrate 110, corresponding to the storage node contacts 190 respectively. In one embodiment, the storage node pads 220 also include a low resistant metal material such as aluminum, titanium, copper or tungsten, for example including a material different from that of the plugs 195, but are not limited thereto. Preferably, in another embodiment, the storage node pads and the plugs 195 may optionally be monolithic to include the same material. Then, a capacitor structure (not shown in the drawings) may be formed on the substrate 110, to directly contact the storage node pads 220 underneath for electrically connection. The capacitor structure further includes a capacitor bottom electrode layer (not shown in the drawings), a capacitor dielectric layer (not shown in the drawings), and a capacitor top electrode layer (not shown in the drawings), thereby forming a plurality of vertically extended capacitors (not shown in the drawings) to serve as the storage nodes (SN) of the semiconductor device 100. Then, the storage nodes may be electrically connected to the transistor element through the storage node pads 220 and the storage node contacts 190, so as to maintain the optimized connection between the capacitor structure and the storage node contacts 190.

Through these performances, the semiconductor device 100 of the first embodiment of the present disclosure is completed. Accordingly to the fabricating method of the present embodiment, the metal silicidation process is additionally performed to form the metal silicide layer 201 between the plugs 193 and the plugs 195. The metal silicide layer 201 straddles the plugs 193 and the spacer 175 at the same time, so that, the two end surface at two sides of the metal silicide layer 201 may be clamped between the spacer 171 and the spacer 175 to have the width W2 which is greater than that of the plugs 193. Also, the metal silicide layer 201 simultaneously contacts the spacer 171 (the sidewall thereof) and the spacer 175 (the top surface 175a thereof). Then, the plugs 195 disposed on the metal silicide layer 201 may therefore obtain a relative larger contact area, and the storage node contacts 190 may obtain more stable structure. Meanwhile, the storage node pads 220 and the storage nodes formed subsequently may be electrically connected with the transistor element through the storage node contacts 190, thereby maintaining an optimized contact relationship between the capacitor structure and the storage node contacts 190.

Furthermore, people skilled in the arts may fully understand that the semiconductor device and the fabricating method thereof in the present disclosure is not limited to be the aforementioned type, and which may include other types. The following description will detail the different embodiments of the semiconductor device and the fabricating method thereof. To simplify the description, the following description will detail the dissimilarities among the different embodiments and the identical features will not be redundantly described. In order to compare the differences between the embodiments easily, the identical components in each of the following embodiments are marked with identical symbols.

Figure 8:
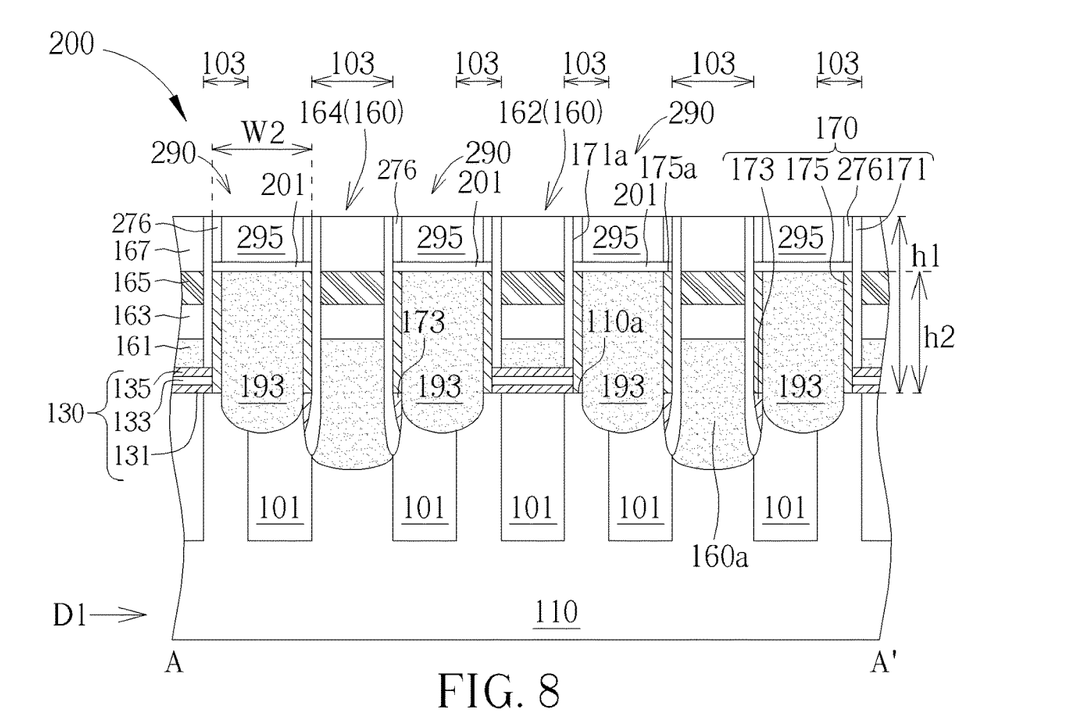
FIG. 8 is a schematic diagram illustrating a semiconductor device according to a second preferable embodiment in the present disclosure.

Please refer to FIG. 8, which illustrate a cross-sectional view of a semiconductor device 200 according to the second embodiment of the present disclosure. The structure of the semiconductor device 200 of the present embodiment is substantially the same as those of the semiconductor device 100 of the aforementioned first embodiment, including forming the substrate 110, the word lines 120 (not shown in FIG. 8), and the bit lines 160, which will not be redundantly described hereinafter. The difference between the present embodiment and the aforementioned first embodiment is in that a spacer 176 is additionally formed on the metal silicide layer 201.

Precisely speaking, after forming the metal silicide layer 201, a deposition and etching bask process is performed in the present embodiment to form the spacer 276, followed by forming the plugs 295. Accordingly, the spacer 276 may be disposed on the spacer 175 and the metal silicide layer 201, being coplanar with the top surface of the spacer 171. Then, the spacer 276, the spacer 175 and the spacer 171 disposed on the substrate 110, and the spacer 173 disposed in the substrate 110, may together form the spacer structure 170 of the present embodiment.

Through these performances, the semiconductor device 200 of the second embodiment in the present disclosure may also include the metal silicide layer 201 additionally disposed between the plugs 193 and the plugs 295. The metal silicide layer 201 straddles the spacer 175, so that, the two end surface at two sides of the metal silicide layer 201 may be clamped between the spacer 171 and the spacer 175 to have larger contact area. Then, the storage node contacts 290 may obtain a more stable structure, and the metal silicide layer 201 may further reduce the resistance of the storage node contacts 290, thereby improving the electrically connection between the storage node contacts 290 and the transistor element within the substrate 110.

Figure 9:
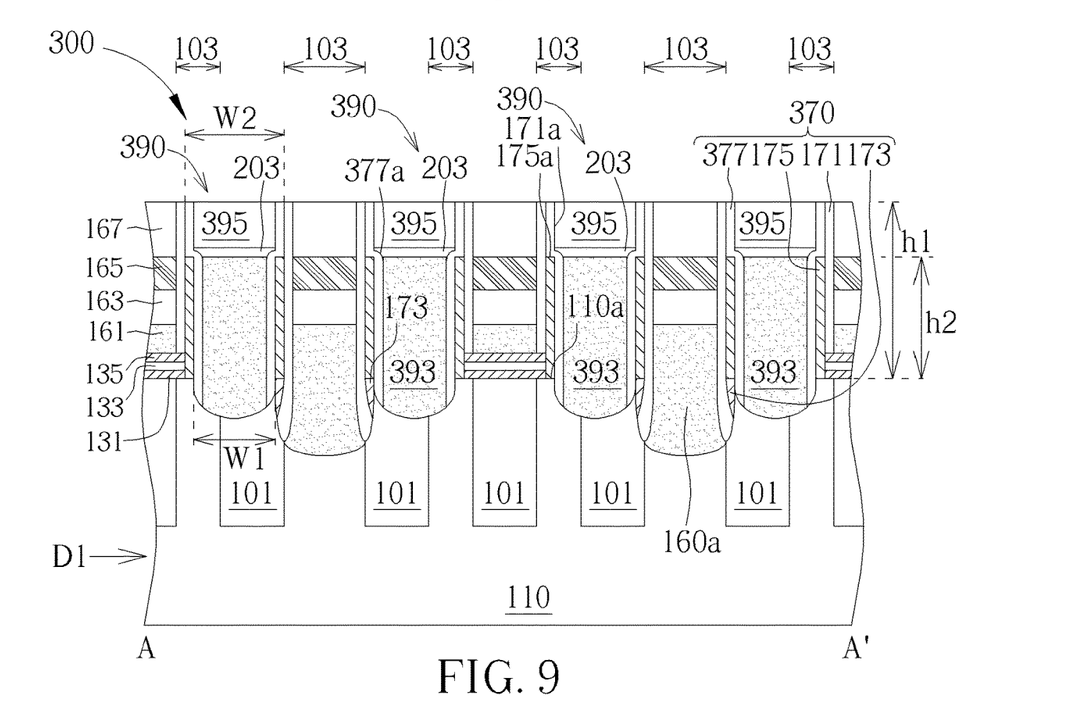
FIG. 9 is a schematic diagram illustrating a semiconductor device according to a third preferable embodiment in the present disclosure.

Please refer to FIG. 9, which illustrate a cross-sectional view of a semiconductor device 300 according to the third embodiment of the present disclosure. The structure of the semiconductor device 300 of the present embodiment is substantially the same as those of the semiconductor device 100 of the aforementioned first embodiment, including forming the substrate 110, the word lines 120 (not shown in FIG. 9), and the bit lines 160, which will not be redundantly described hereinafter. The difference between the present embodiment and the aforementioned first embodiment is in that a spacer structure 370 further includes a spacer 377 disposed on the spacers 175, 171.

Precisely speaking, after forming the spacer 175 with the height h2 being smaller than that of the spacer 171, a deposition and etching bask process is performed in the present embodiment to form the spacer 377, followed by forming plugs 393, a metal silicide layer 203 and plugs 395. Accordingly, the spacer 377 may be disposed between the spacer 175 and the plugs 393, to directly contact the sidewall 171a of the spacer 171, and the top surface 175a and the sidewall of the spacer 175. Then, a portion of the spacer 377 covered on the top surface 175a of the spacer 175 may form a shoulder 377a according to the height difference (h2−h1) between the spacers 171, 175, and the end faces at two sides of the metal silicide layer 203 may be clamped on the shoulder 377a of the spacer 377 and have the width W2 which is greater than that of the plugs 393, as shown in FIG. 9. In the present embodiment, the spacer 377 is also disposed on the substrate 110 and extends from the top surface 110a of the substrate to obtain the same height h1 as the spacer 171, but is not limited thereto. In another embodiment, the spacer 377 may optionally include another height (not shown in the drawings) which is greater than the height h2 and is smaller than the height h1.

Through these performances, the semiconductor device 300 of the third embodiment in the present disclosure may also include the metal silicide layer 203 additionally disposed between the plugs 393 and the plugs 395. The metal silicide layer 203 straddles over the shoulder 377a of the spacer 377, so that, the two end surface at two sides of the metal silicide layer 203 may be clamped between the spacer 171 and the spacer 175 to directly contact the spacer (the sidewall 171a thereof) and the spacer 175 (the top surface 175a thereof). Then, the plugs 395 disposed on the metal silicide layer 203 may therefore have a larger contact area, and the storage node contacts 390 may obtain a more stable structure. Furthermore, the metal silicide layer 203 may also reduce the resistance of the storage node contacts 390, thereby improving the electrically connection between the storage node contacts 390 and the transistor element within the substrate 110.

Figure 10:
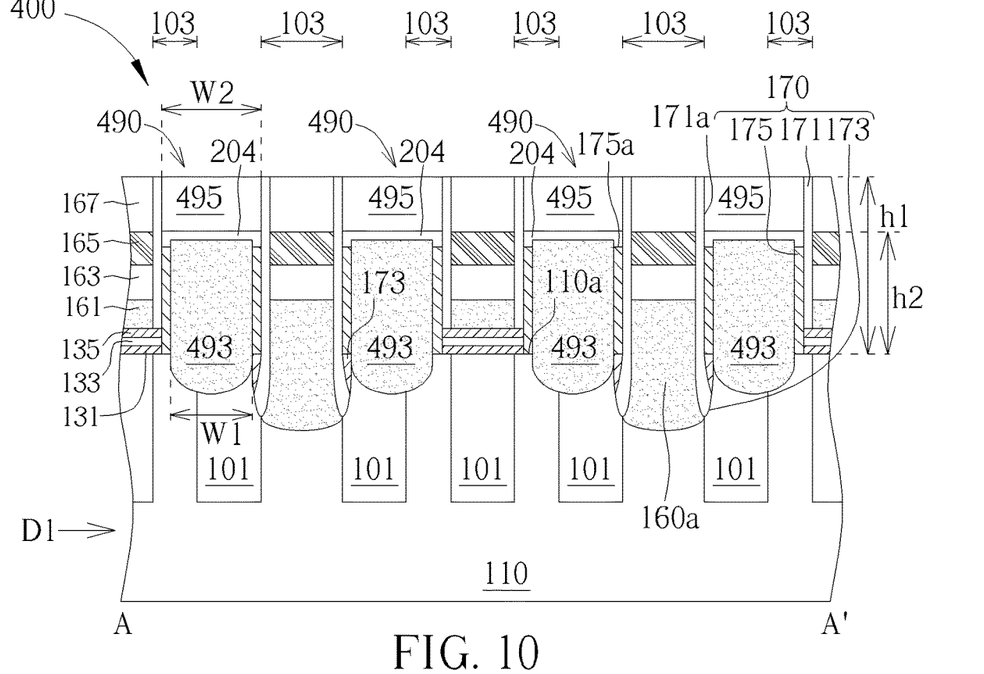
FIG. 10 is a schematic diagram illustrating a semiconductor device according to a fourth preferable embodiment in the present disclosure.

Please refer to FIG. 10, which illustrate a cross-sectional view of a semiconductor device 400 according to the fourth embodiment of the present disclosure. The structure of the semiconductor device 400 of the present embodiment is substantially the same as those of the semiconductor device 100 of the aforementioned first embodiment, including forming the substrate 110, the word lines 120 (not shown in FIG. 10), and the bit lines 160, which will not be redundantly described hereinafter. The difference between the present embodiment and the aforementioned first embodiment is in that the top surface of the plugs 493 is higher than the top surface 175a of the spacer 175, so that, a metal silicide layer 204 formed through the metal silicidation process may obtain a reversed U-shape.

Precisely speaking, while etching the portion of the spacer 175 and the conductive layer 191 in the present embodiment, the top surface (not shown in the drawings) of the etched conductive layer 191 may be obviously higher than the top surface 175a of the spacer 175. Then, the top surface of the plugs 493 may be higher than the top surface 175a of the spacer 175, after forming the metal silicide layer 204, so that, a groove (not shown in the drawings) may be formed between the top surface of the plugs 493 and the top surface 175a of the spacer 175. After that, since the lattice structure of the metal silicide layer 204 is greater than the lattice structure of the conductive layer 191, the volume of the metal silicide layer 204 may slightly expand and fill up the groove, thereby performing a reversed U-shape as shown in FIG. 10. With these arrangements, the metal silicide layer 204 may directly contact the sidewall 171a of the spacer 171, the top surface 175a of the spacer 175, and the partial sidewall of the plugs 493, as shown in FIG. 10.

Through these performances, the semiconductor device 400 of the fourth embodiment in the present disclosure may also include the metal silicide layer 204 additionally disposed between the plugs 493 and the plugs 495. The metal silicide layer 204 straddles the spacer 175, so that, the two end surface at two sides of the metal silicide layer 204 may be clamped between the spacer 171 and the spacer 175 to fill up the groove between the top surface of the plugs 493 and the top surface 175a of the spacer 175. Also, the metal silicide layer 204 may directly contact the spacer 171 (the sidewall 171a thereof) and the spacer 175 (the top surface 175a thereof) at the same time. Then, the plugs 495 disposed on the metal silicide layer 204 may therefore have a larger contact area, and the storage node contacts 490 may obtain a more stable structure. Furthermore, the metal silicide layer 204 may also reduce the resistance of the storage node contacts 490, thereby improving the electrically connection between the storage node contacts 490 and the transistor element within the substrate 110.

Figure 11:
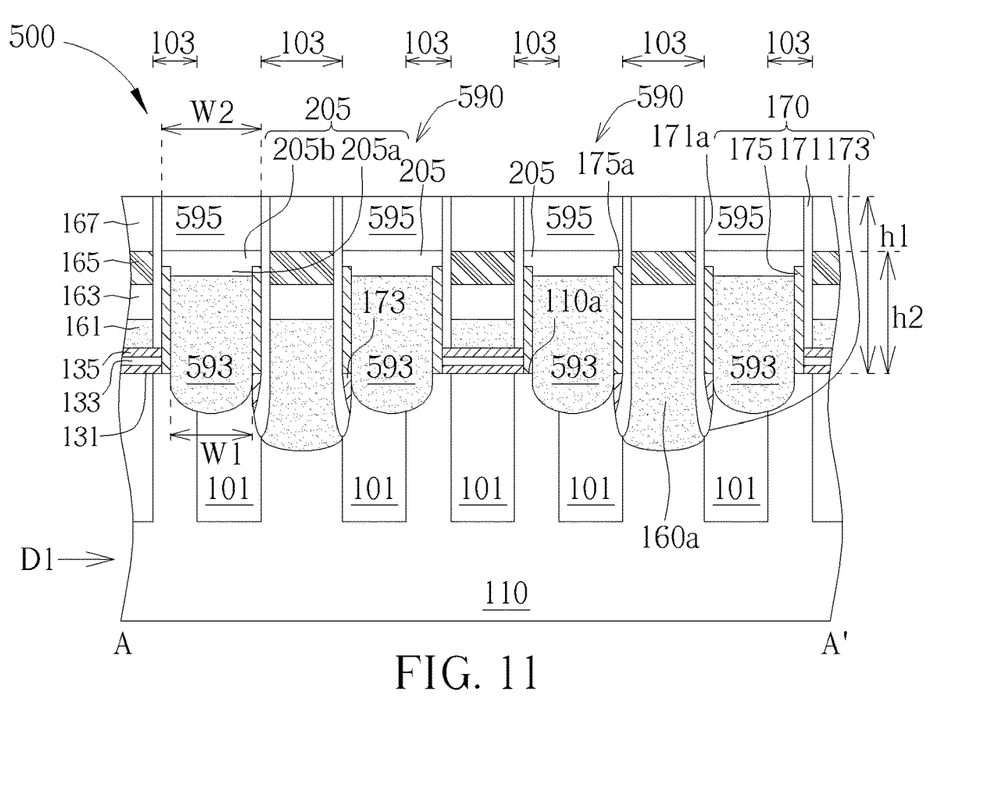
FIG. 11 is a schematic diagram illustrating a semiconductor device according to a fifth preferable embodiment in the present disclosure.

Please refer to FIG. 11, which illustrate a cross-sectional view of a semiconductor device 500 according to the fifth embodiment of the present disclosure. The structure of the semiconductor device 500 of the present embodiment is substantially the same as those of the semiconductor device 100 of the aforementioned first embodiment, including forming the substrate 110, the word lines 120 (not shown in FIG. 11), and the bit lines 160, which will not be redundantly described hereinafter. The difference between the present embodiment and the aforementioned first embodiment is in that the top surface of the plugs 593 is lower than the top surface 175a of the spacer 175, so that, a metal silicide layer 205 formed through the metal silicidation process may obtain a T-shape.

Precisely speaking, while etching the portion of the spacer 175 and the conductive layer 191 in the present embodiment, the top surface (not shown in the drawings) of the etched conductive layer 191 may be lower than the top surface 175a of the spacer 175. Then, the top surface of the plugs 593 may be lower than the top surface 175a of the spacer 175 after forming the metal silicide layer 205, so that, a height difference (not shown in the drawings) may be presented between the top surface of the plugs 593 and the top surface 175a of the spacer 175. After that, since the lattice structure of the metal silicide layer 205 is greater than the lattice structure of the conductive layer 191, the volume of the metal silicide layer 205 may slightly expand and extend to the top surface 175a of the spacer 175, thereby performing a T-shape as shown in FIG. 11. With these arrangements, the metal silicide layer 205 may include a first part 205a and a second part 205b with different widths, wherein the width of the first part 205a is substantially the same as the maximum width W1 of the plugs 593 in the direction D1, and the width of the second part 205b is substantially the same as the maximum width W2 of the plugs 595 in the direction D2. Also, the metal silicide layer 205 may directly contact the sidewall 171a of the spacer 171, and the top surface 175a and the sidewall of the spacer 175 to form a more stable structure as shown in FIG. 11.

Through these performances, the semiconductor device 500 of the fifth embodiment in the present disclosure may also include the metal silicide layer 205 additionally disposed between the plugs 593 and the plugs 595. The metal silicide layer 205 straddles the spacer 175, so that, the two end surface at two sides of the metal silicide layer 205 may be clamped between the spacer 171 and the spacer 175. Also, the metal silicide layer 205 may include the first part 205a and the second part 205b with different widths, and which may simultaneously contact the spacer 171 (the sidewall 171a thereof) and the spacer 175 (the top surface 175a thereof) to obtain a more reliable structure. Then, the plugs 595 disposed on the metal silicide layer 205 may therefore have a larger contact area, so as to improve the stability of the structure of the storage node contacts 590. Furthermore, the metal silicide layer 205 may also reduce the resistance of the storage node contacts 490, thereby improving the electrically connection between the storage node contacts 590 and the transistor element within the substrate 110.

Figure 12:
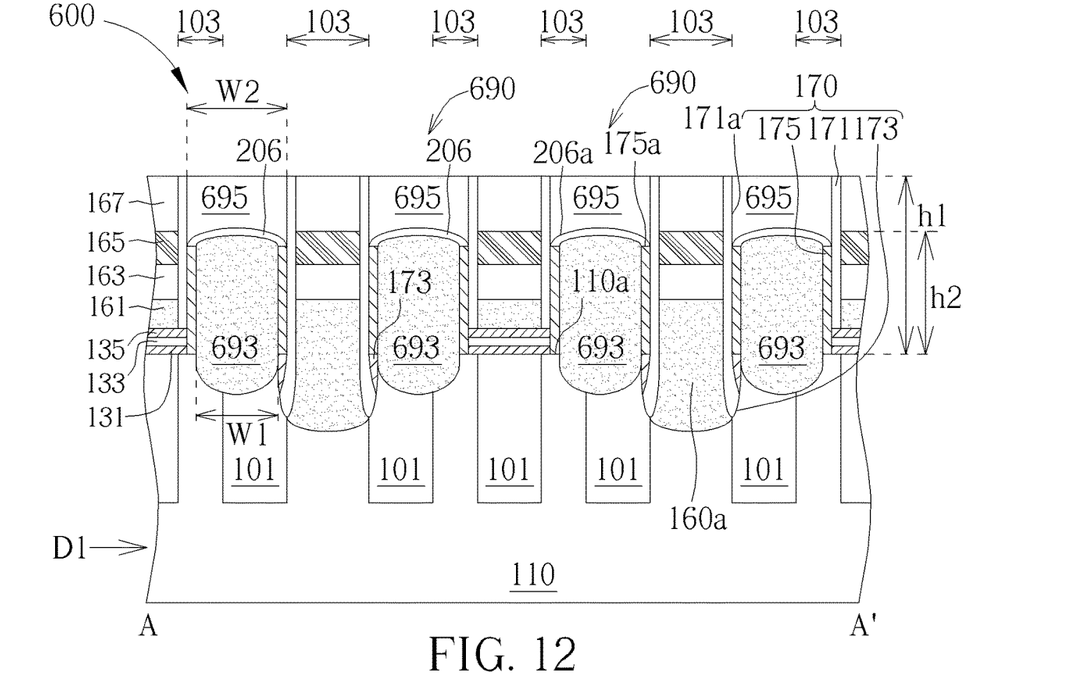
FIG. 12 is a schematic diagram illustrating a semiconductor device according to a sixth preferable embodiment in the present disclosure.

Please refer to FIG. 12, which illustrate a cross-sectional view of a semiconductor device 600 according to the sixth embodiment of the present disclosure. The structure of the semiconductor device 600 of the present embodiment is substantially the same as those of the semiconductor device 100 of the aforementioned first embodiment, including forming the substrate 110, the word lines 120 (not shown in FIG. 12), and the bit lines 160, which will not be redundantly described hereinafter. The difference between the present embodiment and the aforementioned first embodiment is in that the conditions of the metal silicidation process are adjusted to form a metal silicide layer 206 with an arch shape.

Precisely speaking, while etching the portion of the spacer 175 and the conductive layer 191 in the present embodiment, the top surface (not shown in the drawings) of the etched conductive layer 191 may be slight higher than the top surface 175a of the spacer 175, and also, the conditions such as the metal silicidation rate of the metal silicidation process is controlled. Then, the metal silicide layer 206 with the arch shape may be formed, and the top surface of the plugs 693 may present an arc surface after forming the metal silicide layer 206, with the two sides of the arc surface being substantially coplanar with the top surface 175a of the spacer 175, and with the center of the arc surface being slightly higher than the top surface 175a of the spacer 175, as shown in FIG. 12.

The top surface of the contact 693 may present an arc surface, two sides of which may be substantially flush with the top surface 175a of the spacer 175, and the center of which is slightly higher than the top surface 175a of the spacer 175, as shown in FIG. 12. Correspondingly, the metal silicide layer 206 also includes an arc top surface 206a having the center thereof being higher than the top surface 175a of the spacer 175, and which is further extended to the top surface 175a of the spacer 175, to form the arch shape as shown in FIG. 12. Accordingly, the two end surfaces at two sides of the metal silicide layer 206 may also clamped between the spacer 175 to obtain the width W2 being greater than that of the plugs 693, so as to increase the contact area between the metal silicide layer 206 and the plugs 695 over the metal silicide layer 206. Then, the structure stability of the storage node contacts 690 may be effectively improved.

Through these performances, the semiconductor device 600 of the sixth embodiment in the present disclosure may also include the metal silicide layer 206 additionally disposed between the plugs 693 and the plugs 695. The metal silicide layer 206 straddles the spacer 175, so that, the two end surface at two sides of the metal silicide layer 206 may be clamped between the spacer 171 and the spacer 175, and directly contact the spacer 171 (the sidewall 171a thereof) and the spacer 175 (the top surface 175a thereof). Also, the arc top surface 206a of the metal silicide layer 206 may further increase the contact area of the plugs 695 and reduce the resistance of the storage node contacts 690, so as to obtain a more reliable structure. Accordingly, the electrically connection between the storage node contacts 690 and the transistor element within the substrate 110 may be further improved.

Figure 13:
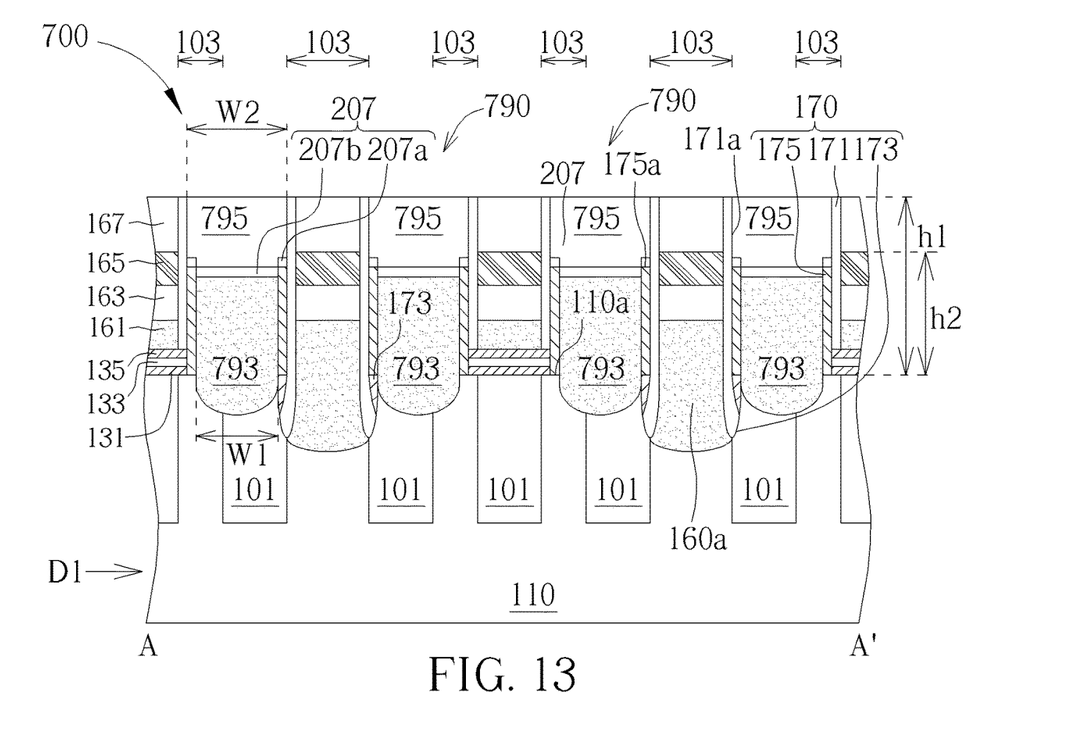
FIG. 13 is a schematic diagram illustrating a semiconductor device according to a seventh preferable embodiment in the present disclosure.

Please refer to FIG. 13, which illustrate a cross-sectional view of a semiconductor device 600 according to the seventh embodiment of the present disclosure. The structure of the semiconductor device 700 of the present embodiment is substantially the same as those of the semiconductor device 100 of the aforementioned first embodiment, including forming the substrate 110, the word lines 120 (not shown in FIG. 13), and the bit lines 160, which will not be redundantly described hereinafter. The difference between the present embodiment and the aforementioned first embodiment is in that the conditions of the metal silicidation process are adjusted to form a metal silicide layer 207 with a stepped shape.

Precisely speaking, while etching the portion of the spacer 175 and the conductive layer 191 in the present embodiment, the top surface (not shown in the drawings) of the etched conductive layer 191 may be slight lower than the top surface 175a of the spacer 175, and also, the conditions such as the metal silicidation rate of the metal silicidation process is controlled, with the metal silicide layer 207 being expanded to the top surface 175a of the spacer 175 in an equal proportion when being formed. Then, the metal silicide layer 207 with the stepped shape may be formed, and which includes a first part 207a disposed on the plugs 793 and a second part 207b disposed on the spacer 175. There is an obvious height different between the top surfaces of the first part 207a and the second part 207b, as shown in FIG. 13. Then, the end surfaces of the second part 207b of the metal silicide layer 207 may also be clamped between the spacer 175 to obtain the width W2 being greater than that of the plugs 693, so that the metal silicide layer 207 may entirely obtain the width W2 which is greater than that of the plugs 793, thereby increasing the contact area between the metal silicide layer 207 and the plugs 795 disposed above, and effectively improving the structure stability of the storage node contacts 790.

Through these performances, the semiconductor device 700 of the seventh embodiment in the present disclosure may also include the metal silicide layer 207 additionally disposed between the plugs 793 and the plugs 795. The metal silicide layer 207 straddles the spacer 175, so that, the two end surface at two sides of the metal silicide layer 207 may be clamped between the spacer 171 and the spacer 175, and directly contact the spacer 171 (the sidewall 171a thereof) and the spacer 175 (the top surface 175a thereof). Also, the metal silicide layer 207 with the stepped shape may further increase the contact area of the plugs 795 and reduce the resistance of the storage node contacts 790, so as to obtain a more reliable structure. Accordingly, the electrically connection between the storage node contacts 790 and the transistor element within the substrate 110 may be further improved.

Overall speaking, the semiconductor device of the present disclosure additionally disposes a metal silicide layer between the bottom plug and the top plug through a metal silicidation process, so that, the end surfaces at two sides of the metal silicide layer may be clamped between the spacer and the metal silicide layer may therefore obtain a width larger than that of the bottom plug. Accordingly, the metal silicide layer and the top plug may have relative larger contact area therebetween, and the storage node contact of the present semiconductor device may obtain a more stable structure thereby. Also, the metal silicide layer may include a material such as titanium silicide, tungsten silicide, tantalum silicide, molybdenum silicide, cobalt Silicide, or nickel silicide, to further reduce the resistance of the storage node contact, and to improve the electrically connection between the metal silicide layer and the transistor element. In this way, the semiconductor device may gain an optimized structure and device performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising;
   a substrate;
   a plurality of bit lines, disposed on the substrate;
   a plurality of first plugs, disposed on the substrate and separated from the bit lines;
   a first spacer, disposed on the substrate and between the bit lines and the first plugs, the first spacer extended upwardly from a top surface of the substrate by a first height;
   a second spacer, disposed on the substrate and between the first spacer and the first plugs, the second spacer extended upwardly from the top surface of the substrate by a second height, wherein the first height is higher than the second height;
   a third spacer, disposed below the second spacer, and the third spacer extending into the substrate;
   a plurality of second plugs, disposed on the first plugs respectively; and
   a metal silicide layer, disposed between the first plugs and the second plugs, wherein an end portion of the metal silicide layer is clamped between the second spacer and the first spacer.

2. The semiconductor device according to claim 1, wherein a maximum width of the metal silicide layer is greater than a maximum width of the first plugs.

3. The semiconductor device according to claim 1, wherein the metal silicide layer directly contacts a sidewalls of the first spacer layer and a top surface of the second spacer.

4. The semiconductor device according to claim 1, wherein a top surface of the first plugs is higher than a top surface of the second spacer, and the metal silicide layer directly contacts a sidewall of the first spacer, a top surface of the second spacer, and a partial sidewall of the first plugs.

5. The semiconductor device according to claim 4, wherein the metal silicide layer comprises a reversed U-shape.

6. The semiconductor device according to claim 1, wherein a top surface of the first plugs is lower than a top surface of the second spacer, and the metal silicide layer directly contacts a sidewall of the first spacer, and a top surface and a sidewall of the second spacers.

7. The semiconductor device according to claim 6, wherein the metal silicide layer comprises a first part and a second part with different widths, and the first part is disposed over the second part and comprises a greater width.

8. The semiconductor device according to claim 1, wherein the bit lines comprises a plurality of first bit lines and a plurality of second bit lines, the first bit lines and the second bit lines are alternately arranged with each other, and the second bit lines directly contact the substrate.

9. The semiconductor device according to claim 8, wherein each of the first bit lines and the second bit lines comprises a semiconductor layer, a barrier layer and a conductive layer stacked from bottom to top.

10. The semiconductor device according to claim 8, wherein the third spacer is disposed at two sides of the second bit line.

11. The semiconductor device according to claim 8, further comprising a fourth spacer disposed between the second spacer and the first plugs, wherein the fourth spacer directly contacts a sidewalls of the first spacer, and a top surface and a sidewall of the second spacer, the fourth spacer covers the top surface of the second spacer and has a shoulder, and the end surface of the metal silicide layer is clamped between the shoulder.

12. The semiconductor device according to claim 11, wherein the fourth spacer comprises a third height and the third height is higher than the second height, and is smaller than or equal to the first height.

13. A semiconductor device, comprising:
a substrate;
a plurality of bit lines, disposed on the substrate;
a plurality of first plugs, disposed on the substrate and separated from the bit lines;
a first spacer, disposed on the substrate and between the bit lines and the first plugs, the first spacer extended upwardly from a top surface of the substrate by a first height;
a second spacer, disposed on the substrate and between the first spacer and the first plugs, the second spacer extended upwardly from the top surface of the substrate by a second height, wherein the first height is higher than the second height;
a third spacer disposed below the second spacer that is disposed at two sides of the bit line, and the third spacer extending into the substrate;
a plurality of second plugs, disposed on the first plugs respectively; and
a metal silicide layer, disposed between the first plugs and the second plugs, wherein an end portion of the metal silicide layer is clamped between the second spacer and the first spacer, and is directly contact the first plugs, and a maximum width of the metal silicide layer is greater than a maximum width of the first plugs.

14. The semiconductor device according to claim 13, wherein a top surface of the first plugs is higher than a top surface of the second spacer, and the metal silicide layer directly contacts a sidewall of the first spacer, a top surface of the second spacer, and a partial sidewall of the first plugs.

15. The semiconductor device according to claim 14, wherein the metal silicide layer comprises a reversed U-shape.

16. The semiconductor device according to claim 13, wherein a top surface of the first plugs is lower than a top surface of the second spacer, and the metal silicide layer directly contacts a sidewall of the first spacer, and a top surface and a sidewall of the second spacers.

17. The semiconductor device according to claim 16, wherein the metal silicide layer comprises a first part and a second part with different widths, and the first part is disposed over the second part and comprises a greater width.

18. The semiconductor device according to claim 13, wherein the bit lines comprises a plurality of first bit lines and a plurality of second bit lines, the first bit lines and the second bit lines are alternately arranged with each other, and the second bit lines directly contact the substrate.

19. The semiconductor device according to claim 18, wherein each of the first bit lines and the second bit lines comprises a semiconductor layer, a barrier layer and a conductive layer stacked from bottom to top.

20. A semiconductor device, comprising:
a substrate;
a plurality of bit lines, disposed on the substrate;
a plurality of first plugs, disposed on the substrate and separated from the bit lines;
a first spacer, disposed on the substrate and between the bit lines and the first plugs, the first spacer extended upwardly from a top surface of the substrate by a first height;
a second spacer, disposed on the substrate and between the first spacer and the first plugs, the second spacer extended upwardly from the top surface of the substrate by a second height, wherein the first height is higher than the second height;
a plurality of second plugs, disposed on the first plugs respectively; and
a metal silicide layer, disposed between the first plugs and the second plugs, wherein an end portion of the metal silicide layer is clamped between the second spacer and the first spacer, wherein the metal silicide layer directly contacts a sidewalls of the first spacer layer and a top surface of the second spacer.

* * * * *